United States Patent
Wu et al.

(10) Patent No.: US 7,221,021 B2
(45) Date of Patent: May 22, 2007

(54) METHOD OF FORMING HIGH VOLTAGE DEVICES WITH RETROGRADE WELL

(75) Inventors: Kuo-Ming Wu, Hsinchu (TW); Chen-Bau Wu, Hsinchu (TW); Ruey-Hsin Liu, Hsinchu (TW); Shun-Liang Hsu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/877,450

(22) Filed: Jun. 25, 2004

(65) Prior Publication Data

US 2005/0285218 A1 Dec. 29, 2005

(51) Int. Cl.
*H01L 29/76* (2006.01)
*H01L 29/94* (2006.01)
*H01L 31/00* (2006.01)

(52) U.S. Cl. ............. 257/344; 257/346; 257/408; 257/E29.012; 257/E29.278; 257/E21.435

(58) Field of Classification Search ........... 257/344, 257/346, 408, E29.012, E29.278, E21.435
See application file for complete search history.

(56) References Cited

U.S. PATENT DOCUMENTS

| | | | | |
|---|---|---|---|---|
| 5,298,779 A * | 3/1994 | Nouailhat et al. | ......... | 257/273 |
| 5,547,882 A * | 8/1996 | Juang et al. | ......... | 438/290 |
| 6,156,615 A * | 12/2000 | Kepler | ......... | 438/305 |
| 6,198,139 B1 * | 3/2001 | Ishida | ......... | 257/372 |
| 6,455,893 B1 * | 9/2002 | Gehrmann et al. | ......... | 257/339 |
| 6,506,640 B1 * | 1/2003 | Ishida et al. | ......... | 438/217 |
| 6,551,869 B1 * | 4/2003 | Chai et al. | ......... | 438/204 |
| 6,667,512 B1 * | 12/2003 | Huster et al. | ......... | 257/328 |
| 6,768,173 B2 * | 7/2004 | Hebert | ......... | 257/345 |
| 6,884,688 B2 * | 4/2005 | Esmark et al. | ......... | 438/307 |
| 2001/0049168 A1 * | 12/2001 | Ema | ......... | 438/241 |
| 2002/0064065 A1 * | 5/2002 | Salling | ......... | 365/145 |
| 2002/0149067 A1 * | 10/2002 | Mitros et al. | ......... | 257/409 |
| 2003/0168701 A1 * | 9/2003 | Voldman | ......... | 257/355 |
| 2003/0176009 A1 * | 9/2003 | Rhodes | ......... | 438/57 |
| 2004/0233694 A1 * | 11/2004 | Xue et al. | ......... | 365/145 |
| 2004/0251496 A1 * | 12/2004 | Brown et al. | ......... | 257/337 |
| 2005/0026352 A1 * | 2/2005 | Helm et al. | ......... | 438/228 |
| 2005/0170104 A1 * | 8/2005 | Jung et al. | ......... | 427/569 |
| 2006/0154411 A1 * | 7/2006 | Bu et al. | ......... | 438/184 |

* cited by examiner

*Primary Examiner*—Ngân V. Ngô
(74) *Attorney, Agent, or Firm*—Duane Morris LLP

(57) ABSTRACT

A high voltage device with retrograde well is disclosed. The device comprises a substrate, a gate region formed on the substrate, and a retrograde well placed in the substrate next to the gate region, wherein the retrograde well reduces a dopant concentration on the surface of the substrate, thereby minimizing damages to the gate region.

13 Claims, 4 Drawing Sheets

METHOD OF FORMING HIGH VOLTAGE DEVICES WITH RETROGRADE WELL

BACKGROUND

The present disclosure relates generally to semiconductor devices, and more particularly to a method for using retrograde well for forming Metal-Oxide-Semiconductor (MOS) transistors.

Typically, integrated circuits (ICs) operate at various operating voltages. Therefore, transistors in these ICs must withstand certain voltage thresholds. For example, transistors with gate lengths of less than 0.25 um typically must operate at less than 2.5 volts, while transistors with a longer gate length (>0.3 um) may operate at well over 3 volts. In certain high voltage applications such as power supplies and hard-disk controllers, even higher operating voltages may be required.

One undesirable effect when applying a high operating voltage to a MOS transistor not designed for such a high voltage is the accumulation of hot electrons at and around the junction of the channel and drain of the transistor. In turn, ionized electrons resulting from the hot electrons move to the drain, thereby causing the drain current to increase. When hot electrons increase to a point where the source/drain junction voltage exceeds a certain level, the source/drain junction of the transistor breaks down, thereby causing damage to the transistor. That certain level of source/drain junction voltage is also known as the breakdown voltage, and must be increased in high voltage environments wherein a high operating voltage is applied to the transistors.

In order to provide a higher breakdown voltage, a double diffused drain (DDD) is typically provided in many MOS transistors that need to operate in the high voltage environment. DDDs help to suppress the hot electron effect, thereby reducing electrical breakdown of the source/drain under high operating voltage.

However, high voltage MOS transistors with DDD are typically formed on a semiconductor wafer that also includes low voltage MOS transistors without DDD. Because the thermal budgets of the processes needed for the formation of high voltage MOS transistors are different from that of low voltage MOS transistors, it is difficult to integrate the manufacturing processes of high voltage MOS transistors to those of low voltage MOS transistors without materially causing permanent change to the physical characteristics of these transistors. As an example, since the drain of a high voltage MOS transistor needs to withstand high breakdown voltages, DDD is formed with a process whereby high temperature and long processing time are required. However, the high temperature and long processing time may drive ions in the doped regions of the low voltage MOS transistors into the silicon substrate beyond a predetermined depth, thereby causing the physical characteristics of the low voltage MOS transistors to become uncontrollable. As such, traditional processing methods are not practical in producing advanced semiconductor technologies that have both high voltage and low voltage MOS transistors because of the increasing uncontrollability.

One solution is to use a drain extended transistor, wherein a very lightly doped extension region adjacent to the drain is used. This extension not only allows voltage to be dropped across the extension region, but also reduces the electric field across any part of the gate oxide, thereby preventing breakdown. However, such extensions consume much wafer space, and are known to be very expensive in advanced technologies where transistor densities are high and wafer real estate commands a significant premium.

Desirable in the art of are additional designs that provide improved high voltage designs for advanced semiconductor technologies that may achieve a high breakdown voltage in the smallest-possible surface area.

SUMMARY

In view of the foregoing, the following provides a method that provides an improved high voltage design for advanced semiconductor technologies that may achieve a high breakdown voltage in a relatively small surface area.

In one embodiment, a high voltage device with retrograde well is disclosed. The device comprises a substrate, a gate region formed on the substrate, and a retrograde well placed in the substrate next to the gate region, wherein the retrograde well reduces a dopant concentration on the surface of the substrate, thereby minimizing damages to the gate region.

Such a high voltage device enjoys various advantages including space saving and the increase of voltage tolerance.

The construction and method of operation of the invention, however, together with additional objects and advantages thereof will be best understood from the following description of specific embodiments when read in connection with the accompanying drawings.

DESCRIPTION

The present disclosure will provide a detailed description of a high voltage MOS Field-Effect-Transistor (MOSFET) structure that saves space and allows the traditional low-doped drain masks used for both N-type and P-type to be omitted.

Figure 1:
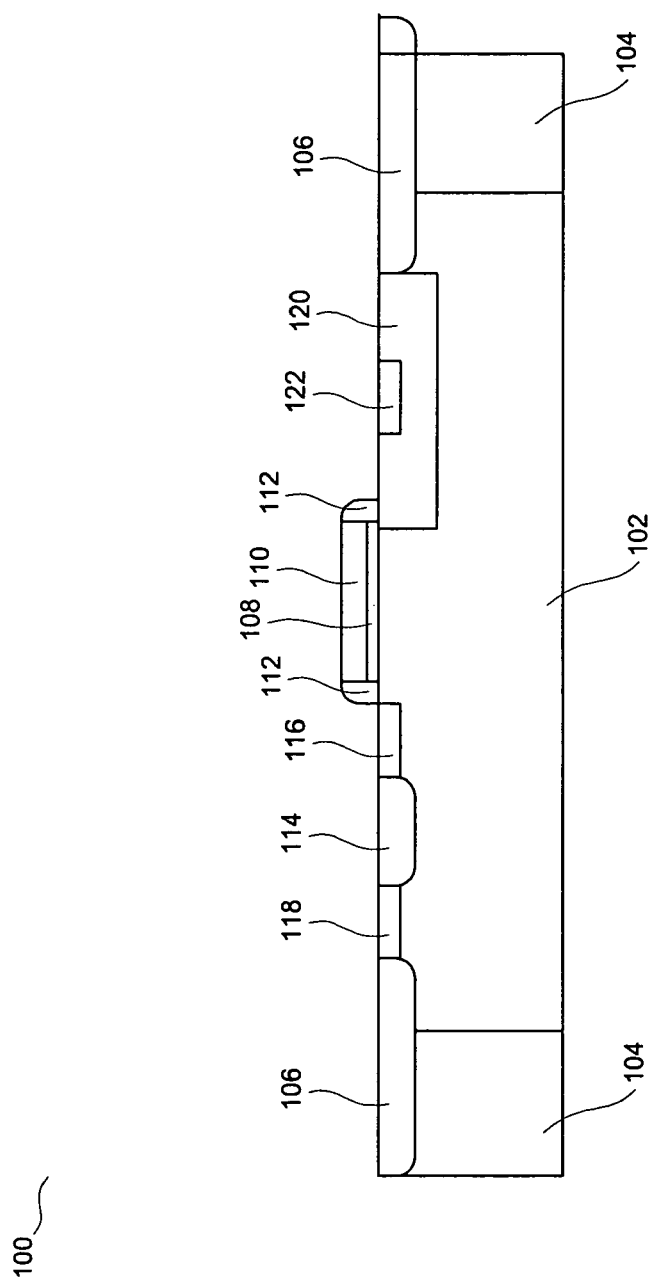
FIG. 1 illustrates an NMOSFET with a retrograde well in accordance with one embodiment of the present disclosure.

FIG. 1 illustrates an N-channel MOSFET (NMOSFET) 100 constructed with structures that achieve high voltage performance in a high voltage range such as from 6 to 35 volts. A P-type deep well 102, of appropriate doping and predetermined depth (usually a relatively deep doping profile) for high voltage devices, is formed within the bulk semiconductor substrate. Adjacent N-type wells 104 are also formed. The NMOSFET is electrically isolated at the surface of the substrate, from other devices, by isolation structures such as a shallow-trench-isolation (STI) or local-oxidation-of-silicon (LOCOS) 106. A thin gate oxide 108 is formed on the surface of the semiconductor substrate and is covered by gate electrode material, typically, poly crystalline silicon 110. Through normal MOS processing, sidewall spacers 112 are formed on the sidewall surfaces of the poly. An oxide layer 114, which may also be STI or LOCOS, or may be thinner, is formed between and separated from the gate sidewall spacer structure 112 and the isolating STI/LOCOS 106. This oxide 114 separates an N+ source region 116, to be formed next to the sidewall spacer of the gate electrode, from a P+ contact 118 to the P-well 102, to be formed next to the STI/LOCOS 106. The P-well 102 may be a well that is suitable for high voltage devices and may be referred to as a high voltage well.

On the other side of the gate oxide structure 108, a low voltage N-well (LVNW) 120, shallower than the P-type well 102, is formed within the P-well 102. This LVNW 120 fills the space between the gate sidewall spacer structure 112 and the STI/LOCOS 106. The LVNW 120 is formed by the implantation of an N-type dopant deeply below the surface. Now, when exposed to high temperature, the N-type dopant diffuses both further downward and also upward toward the surface. Because, unlike traditional diffused substrate, the concentration of the dopant is greatest at the implanted depth and is reduced toward the surface, this arrangement is called a retrograde well. The dopant concentration profile is reversed from that of the traditional arrangement in which the dopant is implanted at a very shallow depth adjacent to the surface and diffused downward. The traditional arrangement produces a highest dopant concentration at the surface and the concentration diminishes downward into the substrate. Here, an N+ doped region 122 is implanted into the middle region of the LVNW 120 and it is separated from the gate sidewall spacer structure 112 and the STI/LOCOS 106. It is understood that the entire LVNW 120 along with the doped region 122 may be referred to as the drain region.

In the traditional arrangement, an N+ doped region is placed immediately adjacently to the sidewall spacer 112 of the gate poly 110. In addition, an N− region, that is, a low-concentration N-type region, is placed in the substrate. This N− region is adjacent to the N+ doped region, and extends to the space under the sidewall spacer, which is adjacent to the gate poly. This is called a low-doped drain (LDD). The LDD here surrounds and isolates the doped region and therefore like an extension of the doped region 122. It is thus referred to as a drain extension (hereinafter DE). The LVNW replaces the LDD of the traditional arrangement and becomes an alternative of DE. The extended space of the DE 120 here is occupied by the reduced N-type dopant that have diffused upward from the implanted depth in the LVNW 120. In operation, the junction between the N-type drain, now surrounded by the LVNW 120, and the P-type well 102, is reverse biased.

It is further understood that although the LVNW 120 is a continuous piece as shown in FIG. 1, it does not have to be so. The LVNW 120 can be two or more discrete or unconnected retrograde wells formed, usually in an aligned manner, to be placed in the area between the STI/LOCOS 106 and the gate. As such, in some embodiments, the doped region 122 may not be entirely within a retrograde well. That is, at least a portion of the dope region 122 may be overlapping or formed within the retrograde well, while some other portions of the doped region may be formed directly within the deep well 102 without the retrograde well 120 situated therebetween.

In the traditional LDD arrangement, the depletion region of the reverse biased junction extends both into the LDD and under the gate poly. In a high voltage application, this places a considerable field gradient of the reverse-biased junction under the edge of the gate poly with the gate oxide in between. The field strength may be enough to damage the gate oxide directly. Additionally, hot electrons are produced and some of them may be injected into the thin gate oxide, thereby potentially causing damage to the oxide. Also, the electron charges trapped in the oxide act as charges in a capacitor causing leakage in the adjacent junction.

In addition, only the retrograde well 120 extends under the edge of the gate oxide 108. The retrograde well 120 has a lower dopant concentration near and all across the substrate surface between the N+ doped region 122 and the surface under the gate poly 110. The reduced dopant concentration causes the electric field gradient of the junction to be spread over a greater distance and therefore to be lower. A lower field gradient adjacent to the thin gate oxide 108 is far less likely to cause damage to the gate oxide 108 or to inject hot electrons into it.

Furthermore, there may also be an isolation area inserted (not shown), in the retrograde well area 120, between gate region 108 and doped region 122. This isolation area may further increase the breakdown voltage threshold between the gate region 108 and doped region 122. The increased breakdown voltage threshold would further lower the possibility of causing undesired damage to the gate region 108 or to inject hot electrons into it.

In short, the traditional LDD structure has been replaced by the retrograde LVNW 120 structure. This, in combination with the N+ doped region 122, is a double diffused drain (DDD). This allows operation at higher voltages. The retrograde LVNW 120 is the same N-type well used for all of the low voltage P-channel MOSFET (PMOSFET) circuitry produced on the same substrate, thereby eliminating the need to use extra masks in the manufacturing processes. In the low voltage circuitry, the traditional LDD structure can be replaced by this same retrograde LVNW 120 structure safely.

Figure 2:
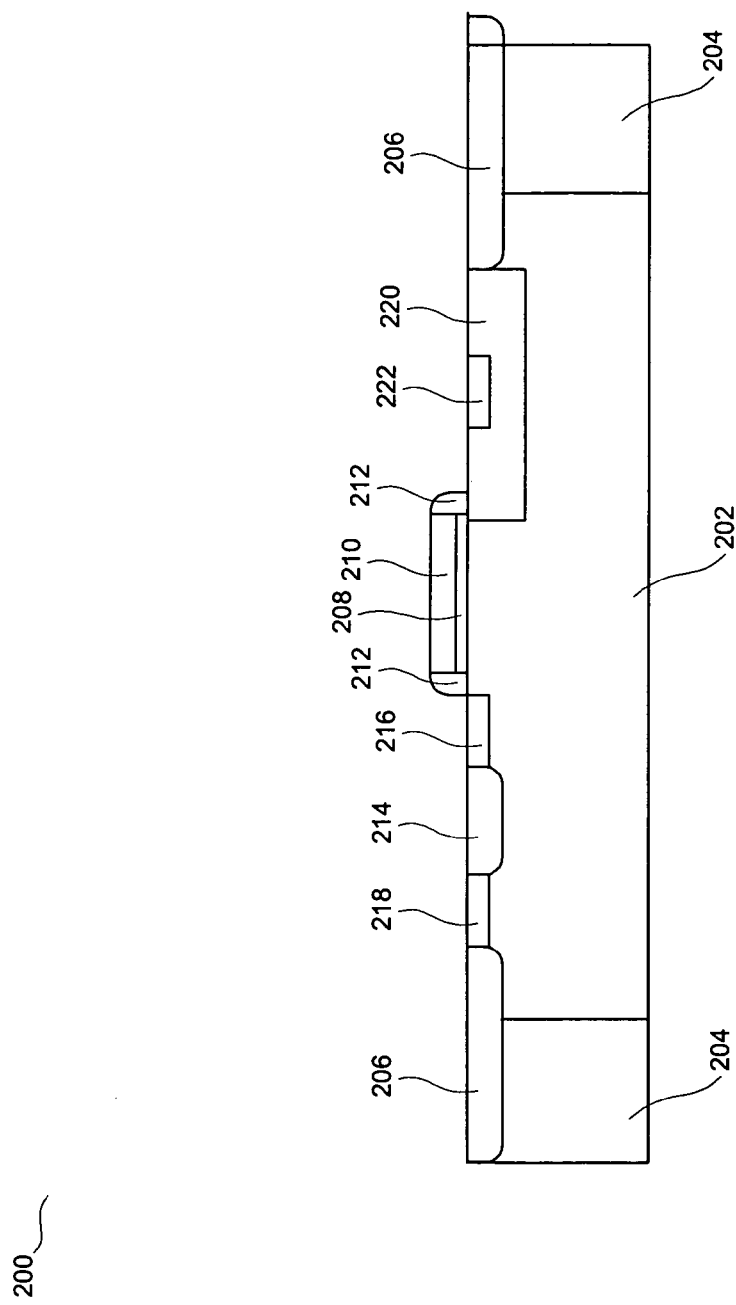
FIG. 2 illustrates a PMOSFET with a retrograde well in accordance with one embodiment of the present disclosure.

FIG. 2 illustrates a P-channel MOSFET (PMOSFET) 200 constructed with structures that achieve high voltage performance in a wide voltage range such as from 6 to 35 volts. An N-type well 202, of appropriate doping and deeper depth for high voltage devices, is formed within the bulk semiconductor substrate. Adjacent P-type wells 204 are also formed. The PMOSFET is electrically isolated at the surface of the substrate, from other devices, by either shallow-trench-isolation (STI) or local-oxidation-of-silicon (LOCOS) 206. A thin gate oxide 208 is formed on the surface of the semiconductor substrate and it is covered by gate electrode material, typically, poly crystalline silicon (poly) 210. Through normal MOS processing, sidewall spacers 212 are formed on the sidewall surfaces of the poly. An oxide layer 214, that may also be STI or LOCOS, or may be thinner, is formed between and separated from the gate sidewall spacer structure 212 and the isolating STI/LOCOS 206. This oxide 214 separates a P+ source region 216, to be formed next to the sidewall spacer of the gate electrode, from an N+ contact 218.

On the other side of the gate oxide structure 208, a low voltage P-well (LVPW) 220, shallower than N-type well 202, is formed within the N-well 202. This LVPW 220 fills the space between the gate sidewall spacer structure 212 and the STI/LOCOS 206. The LVPW 220 is formed by the implantation of a P-type dopant deeply below the surface. Now, when exposed to high temperature, the P-type dopant diffuses both further downward and also upward toward the surface. Because the concentration of the dopant is greatest at the implanted depth and is reduced toward the surface, this is also a retrograde well. The dopant concentration profile is reversed from that of the traditional arrangement in which the dopant is implanted at a very shallow depth adjacent to the surface and diffused downward. The traditional arrangement produces a highest dopant concentration at the surface and the concentration diminishes downward into the substrate. Here, a P+ doped region 222 is implanted into the middle region of the LVPW 220 and it is separated from the gate sidewall spacer structure 212 and the STI/LOCOS 206. In the traditional arrangement, a P+ doped region is placed adjacently to the sidewall spacer 112 of the gate poly 210. Also, in the traditional arrangement, a P− region, that is, a low-concentration P-type region, is placed in the substrate, from the P+ contact, and under the space to be filled by the sidewall spacer, adjacent to the gate poly, which is referred to as a low-doped drain (LDD). Like the LVNW of the N type devices, the LVPW 220 is referred to as a drain extension (DE), and replaces the function of the LDD of the traditional arrangement.

In operation, the junction between the P-type drain, now formed by the LVPW 220, and the N-type well 202, is also reverse biased. Like the N-type structure described above, only the retrograde well 220 extends under the edge of the gate oxide 208. The retrograde well 220 has a lower dopant concentration all across the substrate surface between the P+ doped region 222 and the surface under the gate poly 210. The reduced dopant concentration causes the electric field gradient of the junction to be spread over a greater distance and therefore to be lower. Such a lower field gradient adjacent to the thin gate oxide 208 is unlikely to cause damage to the oxide 208 or to inject or remove hot carriers.

Figure 3:
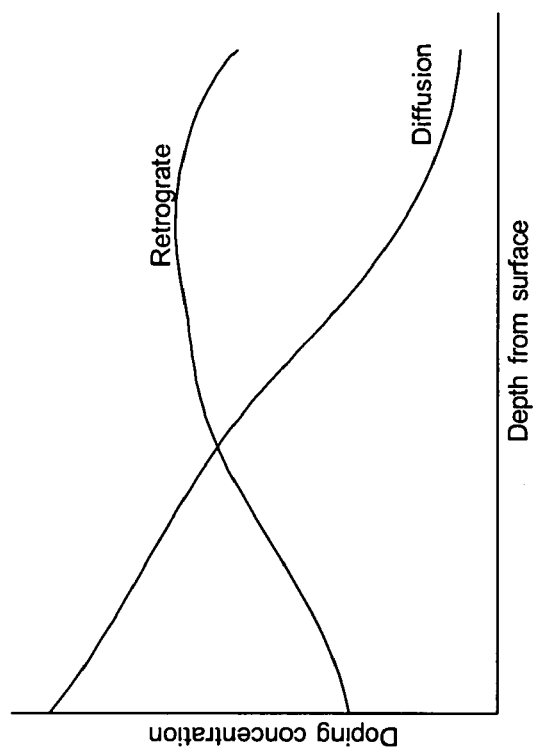
FIG. 3 illustrates concentration profiles in accordance with one embodiment of the present disclosure.

FIG. 3 illustrates the dopant concentration profiles 300 of the retrograde LVNW or LVPW and the traditional diffused N-well or P-well as low-doped drain extension. The traditional diffused profile shows the greatest dopant concentration at the substrate surface because the dopant is implanted at a very shallow depth adjacent to the surface and is then diffused downward only. The portion of the depletion region of a junction in the high dopant surface concentration at the substrate surface will be narrower and therefore, the electric field gradient will be steeper. Current carriers traversing the steeper gradient will be accelerated to higher energies which may cause direct damage to the gate oxide or may cause carriers to be injected into or removed from the thin gate oxide, which degrades MOS performance. In contrast, the retrograde dopant concentration profile shows the greatest dopant concentration at the implanted depth, from which the dopant is diffused both downward and upward toward the surface. The portion of the depletion region of a junction in the lower dopant concentration at the substrate surface, with a LVNW or LVPW, will be broader. Therefore, the electric field gradient will be gentler. Carriers traversing the gentler gradient will not be accelerated to damaging energy levels.

Figure 4:
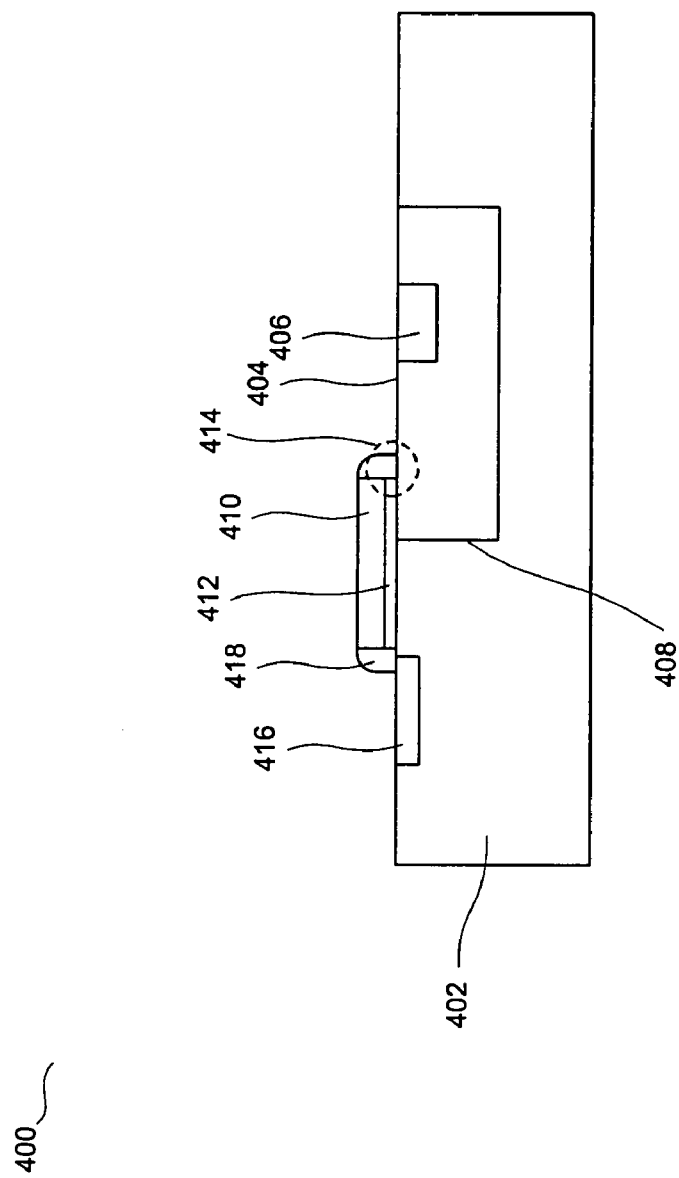
FIG. 4 illustrates a damage-susceptible site in a MOSFET in accordance with one embodiment of the present invention.

FIG. 4 illustrates the location in a MOSFET 400 that is susceptible to damage if current carriers are accelerated to excessively high energy levels by an electric field gradient that is too steep. The electric field of concern appears in the substrate 402 between the high dopant concentration in the doped region 406 and the drain extension end 408, under the edge of the gate poly 410 with the thin gate oxide 412 in between. The gate oxide end 414 is most susceptible to damage. With the presently disclosed method for using the retrograde LVNW (or LVPW) drain extension 408, the high energy stress is much less likely to be formed.

The high voltage device illustrated above enjoys various advantages including space saving and increase of voltage tolerance. In addition, the retrograde well increases surface breakdown threshold voltage, which is important for the operation of any high voltage devices. Since high and low voltage transistors are most likely in co-existence on a chip, having the high voltage devices made by using retrograde wells, at least two mask layers can be saved from the manufacturing process since the high and low voltage devices can be formed without requiring additional masks for high voltage devices. Further, the drain to gate distance is also reduced because of the drain extension. In some situations, when the high voltage well doping profile can be coordinated with the formation of the retrograde well, surface electrical fields can be reduced.

The above disclosure provides many different embodiments or examples for implementing different features of the disclosure. Specific examples of components and processes are described to help clarify the disclosure. These are, of course, merely examples and are not intended to limit the disclosure from that described in the claims.

Although the invention is illustrated and described herein as embodied in detailed examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the disclosure, as set forth in the following claims.

What is claimed is:

1. A transistor device comprising:
   a gate region formed on a substrate;
   a well region formed within the substrate; and
   a drain region comprising at least one retrograde well placed in the substrate next to the gate region,
   wherein the retrograde well reduces a dopant concentration near the surface of the substrate, and the retrograde well and the well region substantially have the same dopant distribution profile.

2. The transistor device of claim 1 wherein the gate region further comprises one or more spacers.

3. The transistor device of claim 1 further comprising a doped region formed in the drain region.

4. The transistor device of claim 3 wherein at least a portion of the doped region is formed within the retrograde well.

5. The transistor device of claim 4 further comprising an isolation structure placed between the doped region and the gate region.

6. The transistor device of claim 1 further comprising a deep well, in which the drain region is formed.

7. The transistor device of claim 6 wherein the drain region is a well shallower than the deep well.

8. A transistor device comprising:
   a substrate;
   a gate region formed on the substrate;
   a deep well formed in the substrate;
   a well region formed within the substrate;
   a source region formed directly in the deep well on a first side of the gate region;
   one or more retrograde wells placed in the substrate next to the gate region and on a second side thereof;
   the one or more retrograde wells forming a doped drain region, and
   wherein the one or more retrograde wells further form a drain extension surrounding the doped drain region to have a lower dopant concentration toward the surface of the substrate, and the one or more retrograde wells and the well region substantially have the same dopant distribution profile.

9. The transistor device of claim 8 wherein the gate region further comprises one or more spacers.

10. The transistor device of claim 8 further comprising at least one isolation structure between the doped drain region and the gate region.

11. The transistor device of claim 8 wherein the deep well and the retrograde wells have different types of dopant.

12. The transistor device of claim 8 wherein the retrograde wells have a shallower doping profile than the deep well.

13. A transistor device comprising:
- a substrate including a surface;
- a gate region formed on the substrate;
- a deep well formed in the substrate;
- a well region formed within the substrate;
- a source region formed directly in the deep well on a first side of the gate region; and
- a doped drain region formed of a plurality of retrograde wells formed in the substrate next to the gate region and on a second opposed side of the gate region, at least one of the plurality of retrograde wells forming a drain extension surrounding the doped drain region and the retrograde wells having a lower dopant concentration toward the surface of the substrate, wherein the retrograde wells and the well region substantially have the same dopant distribution profile.

* * * * *